(12) United States Patent
Marmillion et al.

(10) Patent No.: US 6,242,778 B1
(45) Date of Patent: Jun. 5, 2001

(54) COOLING METHOD FOR SILICON ON INSULATOR DEVICES

(75) Inventors: Patricia McGuinness Marmillion, Colchester; Anthony Michael Palagonia, Underhill; Bernadette Ann Pierson, South Hero; Dennis Arthur Schmidt, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/158,813

(22) Filed: Sep. 22, 1998

(51) Int. Cl.[7] ................................................. H01L 27/01
(52) U.S. Cl. .......................... 257/347; 257/712; 257/713; 257/714; 257/720
(58) Field of Search .................................. 257/720, 712, 257/713, 714, 347

(56) References Cited

U.S. PATENT DOCUMENTS

| | | | |
|---|---|---|---|
| 4,612,083 | 9/1986 | Yasumoto et al. | 156/633 |
| 4,761,681 | 8/1988 | Reid | 357/68 |
| 4,794,092 | 12/1988 | Solomon | 437/51 |
| 4,954,458 | 9/1990 | Reid | 437/51 |
| 5,034,688 | 7/1991 | Moulene et al. | 324/158 |
| 5,091,330 | 2/1992 | Cambou et al. | 437/62 |
| 5,099,311 | 3/1992 | Bonde et al. | 357/82 |
| 5,099,910 | 3/1992 | Walpole et al. | 165/80.4 |
| 5,146,314 | * 9/1992 | Pankove | 357/82 |
| 5,218,515 | 6/1993 | Bernhardt | 361/385 |
| 5,239,200 | 8/1993 | Messina et al. | 257/714 |
| 5,258,887 | * 11/1993 | Fortune | 361/720 |
| 5,265,670 | 11/1993 | Zingher | 165/80.4 |
| 5,316,075 | 5/1994 | Quon et al. | 165/80.4 |
| 5,388,635 | 2/1995 | Gruber et al. | 165/80.4 |
| 5,777,365 | * 7/1998 | Yamaguchi et al. | 257/347 |

* cited by examiner

*Primary Examiner*—Carl Whitehead, Jr.
*Assistant Examiner*—Neal Berezny
(74) *Attorney, Agent, or Firm*—William D. Sabo

(57) ABSTRACT

In a silicon on insulator technology, cooling channels in a support substrate are located substantially under the junction regions of selected individual active devices in a semiconductor layer, where the junction regions are separated from the substrate by an insulating layer. In a second embodiment, thermal conductors in a support substrate are located substantially under the junction regions of selected individual active devices in a semiconductor layer where the junction regions are separated from the substrate by an insulating layer. Optionally, either the cooling channels or the thermal conductors may be enlarged such that a plurality of devices may be cooled by a single cooling channel or thermal conductor.

11 Claims, 9 Drawing Sheets

COOLING METHOD FOR SILICON ON INSULATOR DEVICES

FIELD OF THE INVENTION

The present invention relates to the field of semiconductor chips; more specifically, it relates to the cooling of semiconductor chips fabricated in silicon on insulator technology.

BACKGROUND OF THE INVENTION

Since the development of integrated circuit technology, semiconductor chips have been fabricated on a monocrystalline silicon wafer with active devices such as transistors and diodes fabricated near the top surface of the wafer. These chips often become very hot during operation, especially in the case of logic and microprocessor chips. Traditionally, the method for cooling these chips has been attachment of external heat sinks to the backside of the chip, or to the module into which the chip is packaged. This technology is often referred to as bulk silicon technology.

A more recent technology called silicon on insulator or SOI utilizes a very thin layer of mono-crystalline silicon stacked on top of an insulator, typically silicon oxide, which itself is stacked on top of a thick substrate, most often a silicon wafer. Several methods of fabricating such SOI wafers involve bonding together two wafers, each having an oxidized surface, oxidized surface to oxidized surface, to form the middle insulating silicon oxide, followed by thinning the backside of one of the wafers so as to form a very thin mono-crystalline silicon uppermost layer, with the other wafer becoming the lowermost layer of the stacked SOI wafer. The active devices are fabricated in the uppermost, very thin monocrystalline silicon layer of the stack.

Another feature of SOI technology is the ability to form isolated pockets of mono-crystalline silicon in the very thin mono-crystalline silicon layer by etching down to the middle insulating layer, and then back filling with an insulator such as silicon oxide, or by other methods.

In this newer technology, cooling still utilizes the methods applied to conventional chips fabricated with bulk silicon technology. One problem with the existing cooling techniques, however, is that the heat generated from any individual device or group of devices must travel from the device junctions through the bulk silicon to the backside of the chip where the heatsink can conduct the heat away. The effectiveness of cooling a single device or group of devices is affected by the cooling of the chip as a whole. For SOI, added to this problem is the fact that SOI devices are generally designed to run faster and can generate more heat. If the heat could be conducted away directly at or very near to the device junctions, individual devices or groups running very hot could be cooled more effectively.

With more specific reference to the prior art, U.S. Pat. No. 4,794,092 to Solomon, teaches a method of joining two wafers together using two oxidized wafers, where one or more of the wafers have trenches etched into the surfaces to be joined. These trenches which may or may not be filled with insulating materials (if the trenches are not filled in wafer form, they are filled after dicing), are formed in the street or kerf regions of the wafer. During subsequent dicing operations, silicon at the edges is not exposed due to the insulating material.

U.S. Pat. No. 5,091,330 to Cambou et. al, describes a method of forming islands of monocrystalline silicon in SOI wafers. Trenches are formed in the top of a first mono-crystalline silicon wafer and filled with an insulator. A second silicon wafer having an oxidized surface is joined to this surface by dielectric bonding. The backside of the first wafer is then polished until the mono-crystalline silicon islands are exposed.

U.S. Pat. No. 4,954,458 to Reid teaches a method of cooling a bulk technology chip by etching channels into the backside of the chip, attaching a plate to cover the top of the channels and then forcing cooling fluid through the channels. In this method the cooling channels are located a significant distance from the device junctions, leaving a significant amount of silicon between the channels and the device junctions. The process as described would not be capable of etching extremely fine lines from the backside of the wafer to the junctions of individual devices. Further, stopping at a precise distance from device junctions would be most difficult.

The present invention is directed to providing a method of providing heat sinking at or very near to the device junctions in chips fabricated in SOI technology.

SUMMARY OF THE INVENTION

It is an object of the present invention to describe a structure and provide a method of fabricating the structure for cooling individual semiconductor devices or groups of devices fabricated in SOI technology by locating cooling channels substantially under selected individual semiconductor devices or groups of devices, the channels separated by the insulating layer of the SOI technology from the semiconductor devices.

It is a further object of the present invention to describe a structure and provide a method of fabricating the structure for cooling regions of an SOI chip containing groups of semiconductor devices fabricated in SOI technology by locating cooling channels substantially under selected regions of the chip, the channels separated by the insulating layer of the SOI technology from semiconductor devices in the selected portions of the chip.

It is a still further object of the present invention to describe a method of providing coolant fluid to the cooling channels.

It is another object of the present invention to describe a structure and provide a method of fabricating the structure for cooling individual semiconductor devices or groups of devices fabricated in SOI technology by locating thermal conductors substantially under selected individual semiconductor devices or groups of devices, the thermal conductors separated by the insulating layer of the SOI technology from the semiconductor devices.

It is still another object of the present invention to describe a structure and provide a method of fabricating the structure for cooling regions of an SOI chip containing groups of individual semiconductor devices fabricated in SOI technology by locating thermal conductors substantially under selected regions of the chip, the thermal conductors separated by the insulating layer of the SOI technology from the semiconductor devices in the selected portions of the chip.

It is an additional object of the present invention to describe a structure of and method for attaching a heat sink to such thermal conductors.

BRIEF DESCRIPTION OF DRAWINGS

The novel features believed characteristic of the invention are set forth in the appended claims. The invention itself however, as well as a preferred mode of use, further objects and advantages thereof, will best be understood by reference to the following detailed description of illustrative embodiments when read in conjunction with the accompanying drawings, wherein:

DETAILED DESCRIPTION OF THE PREFERRED EMBODIMENTS OF THE INVENTION

Figure 1:
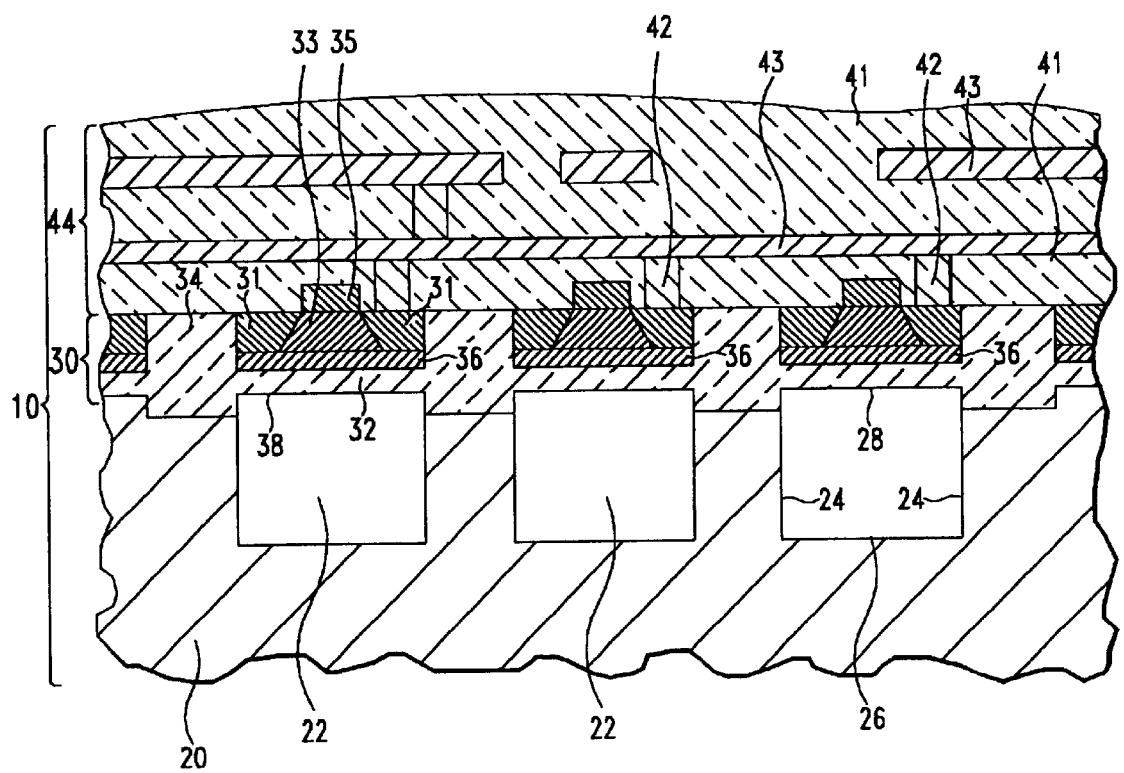
FIG. 1 is a cross-sectional view through part of a chip of a first embodiment of the present invention showing the relationship of the cooling channels to the devices.

FIG. 1 is a cross-sectional view through part of a semiconductor chip 10, comprised of a first substrate 20 bonded to a second substrate 30, showing a first embodiment of the present invention. Substrate 30 contains devices 36, comprised of channel regions 33, source and drain regions 31, and gates 35, separated by optional isolation regions 34. Interlevel wiring layer 44, comprised of interlevel dielectric levels 41, wiring levels 43 and vias 42 disposed thereon, is formed on substrate 30. Substrate 30 is bonded to substrate 20 by means of oxide layer 32. Substrate 20 contains a plurality of hollow cooling channels 22 for circulating a cooling fluid, for example, a gas such as helium or nitrogen. Each channel 22 has sidewalls 24, a bottom surface 26 and top 28. Top 28 of each channel 22 is in contact with bottom surface 38 of oxide layer 32. Each channel 22 is sized and located to substantially align with a respective channel region 33 of each of the devices 36.

Figure 2:
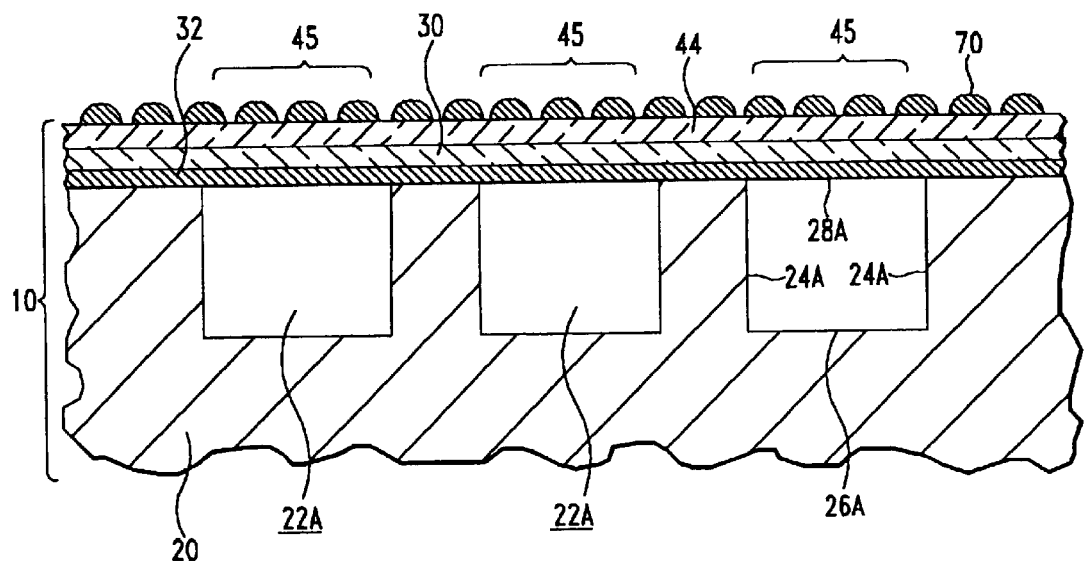
FIG. 2 is a cross-sectional view through part of a chip of a variation of the first embodiment of the present invention showing the relationship of the cooling channels to portions of the chip.

FIG. 2 is similar to FIG. 1 except the scale is much smaller. Channels 22A are sized and located to align with regions 45 of substrate 30, the regions containing a plurality of devices (not shown) so each channel 22A cools many devices 36. In this case the channels 22A may be much larger than channels 22 shown in FIG. 1, and cooling could be made selective to certain portions of chip 10. Solder ball connections 70 are also shown, though wire bond or other interconnection technology would also be suitable as should be apparent to those skilled in the art.

Figure 3:
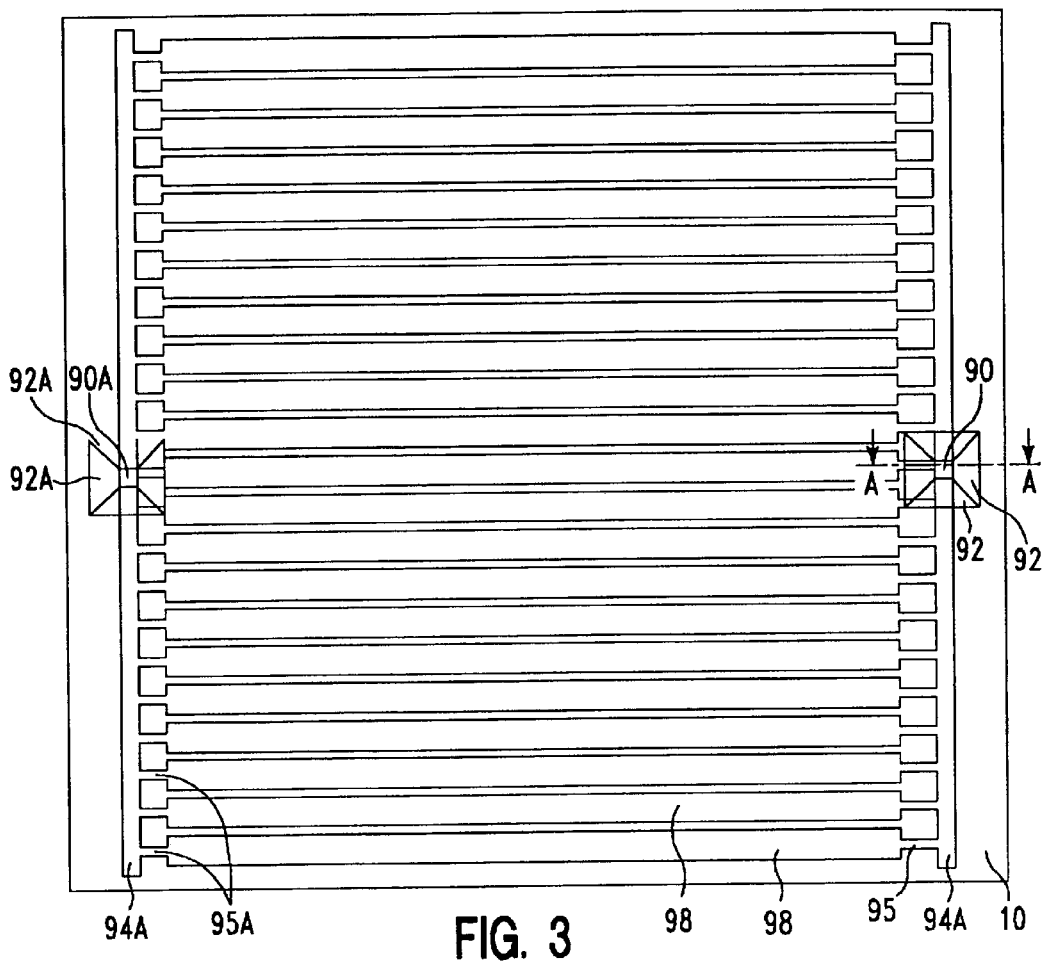
FIG. 3 is a plan view, as viewed from the back of the chip, showing cooling distribution channels.

FIG. 3 is a plan view of chip 10. Inlet 90 supplies inlet manifold channel 94 with coolant. Inlet manifold channel 94 has a plurality of distribution channels 95 supplying cooling units 98. Cooling units 98 are connected to outlet manifold 94A by collection channels 95A. Outlet manifold 94A feeds outlet 90A. Inlet manifold channel 94, distribution channels 95, collection channels 95A and outlet manifold 94A are all formed at the same time channels 22 or 22A are formed. The tops of inlet manifold channel 94, distribution channels 95, collection channels 95A and outlet manifold 94A contact oxide layer 32. While the lengths and layout of distribution channels 95, cooling units 98, and collection channels 95A are shown identically, a wide variety of custom layouts to suit the cooling needs of the chip as driven by its design and layout are possible.

Figure 4:
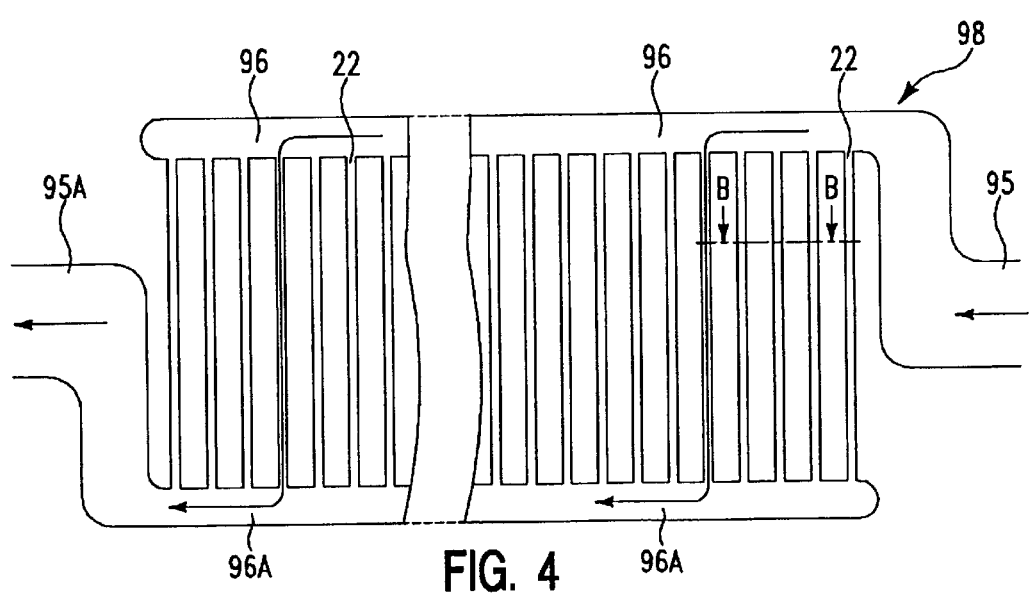
FIG. 4 is a plan view through A—A of FIG. 3 showing cooling channels.

A detail of a cooling unit 98 is shown in FIG. 4. Distribution channel 95 feeds secondary inlet manifold 96 which in turn feeds channels 22. Secondary outlet manifold 96A collects the coolant fluid and directs it to collection channel 95A. Channels 22A may be substituted for channels 22.

Figure 5:
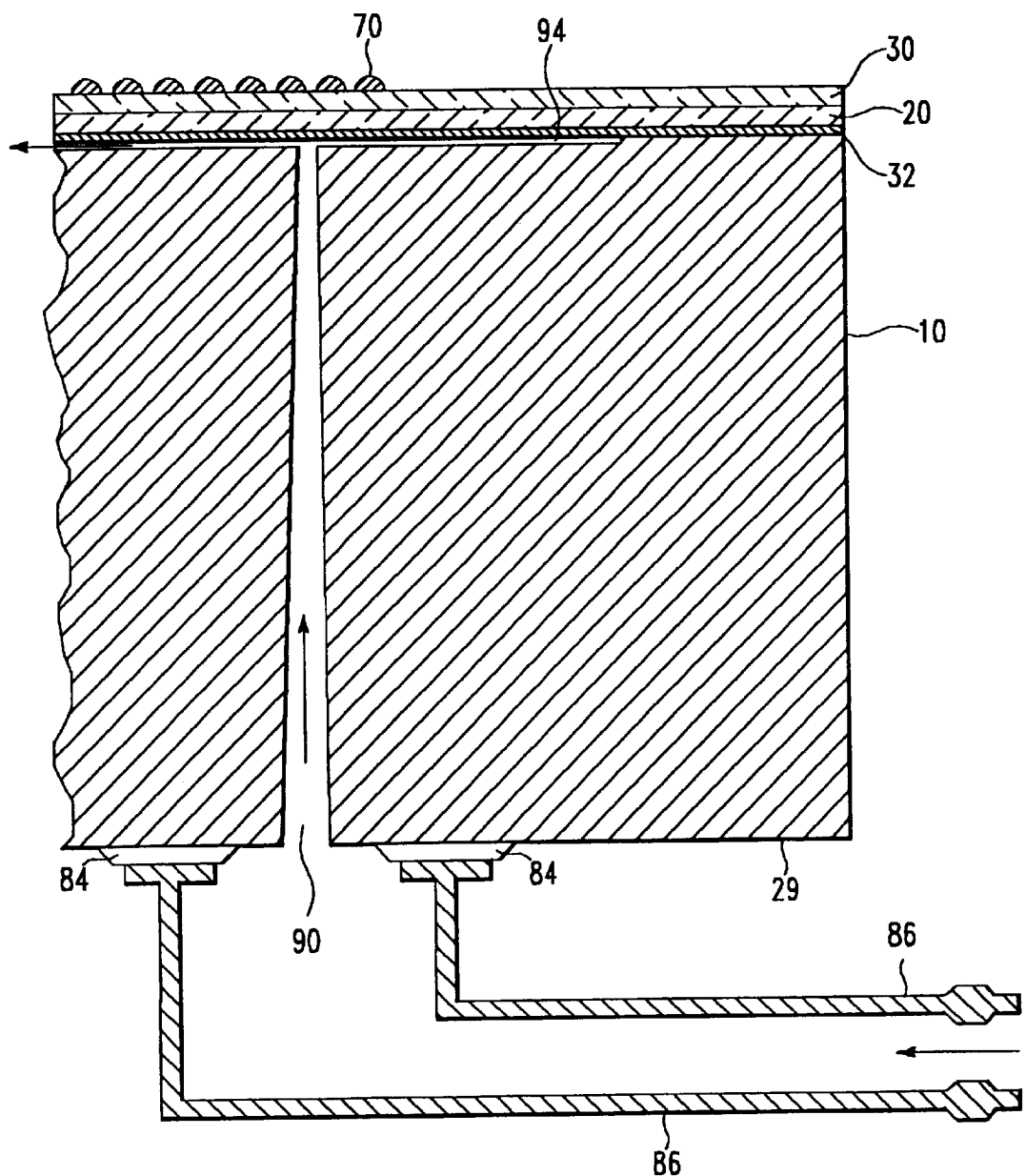
FIG. 5 is cross sectional view through B—B of FIG. 4 illustrating a method of supplying cooling fluid to the chip.

In FIG. 5 a means of connecting a supply line to chip 10 to supply coolant to inlet manifold channel 94 is shown. While the supply side is shown, the outlet side would be similar. Inlet 90 having sidewall 92 is formed in substrate 20. One end of inlet 90 communicates with bottom surface 29 of substrate 20 and the opposite end with inlet manifold channel 94. Inlet 90 may be formed by laser etching, RIE etching, wet etching with strongly caustic etchants or other well known means. A combination such as laser etching most of the inlet and finishing with a wet etch would be preferred. Inlet 90 may alternatively be formed prior to any other operations on substrate 20. Supply tube 86 is connected to bottom surface 29 of substrate 20 by bump 84. Bump 84 may be epoxy or silicone rubber adhesive. Surface 29 may be coated with a thin layer of material such as oxide to promote adhesion of the adhesive. Alternatively, bump 84 may be solder and bottom surface 29 may be coated with a thin stack of metal layers comprising, for example, Al, Cr, Cu and Au.

Figure 6A:
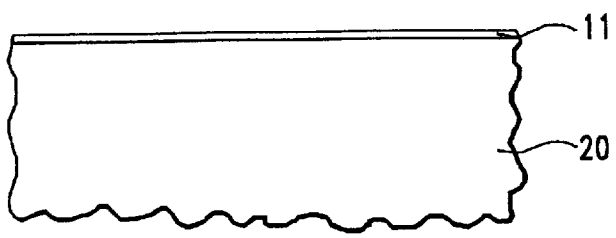
FIGS. 6A thru 6H are side views through part of a chip showing a method of fabrication of the first embodiment of the present invention.
Figure 6B:
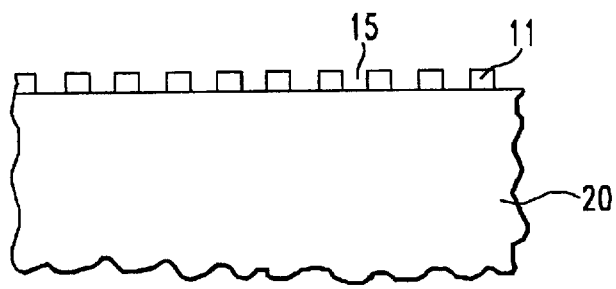
Figure 6C:
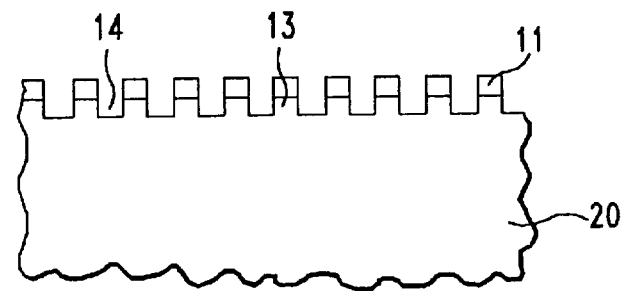
Figure 6D:
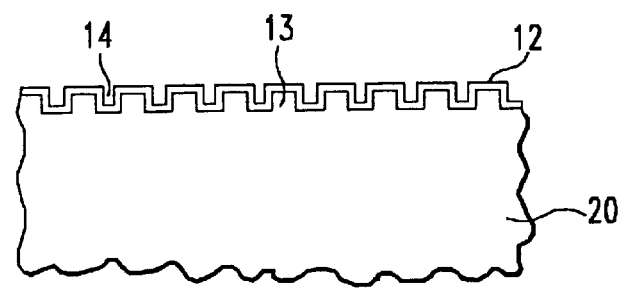
Figure 6E:
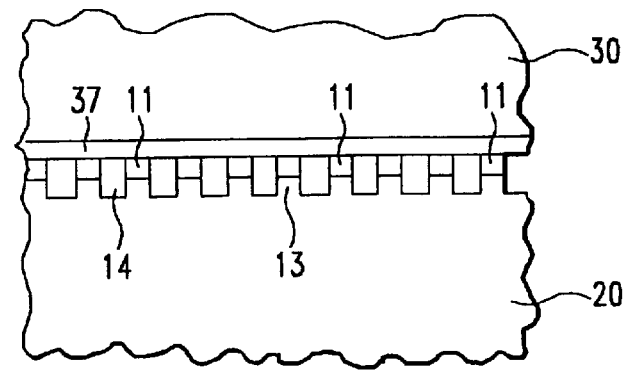
Figure 6F:
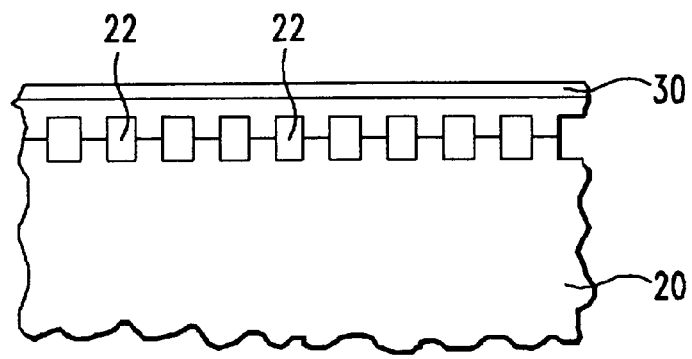
Figure 6G:
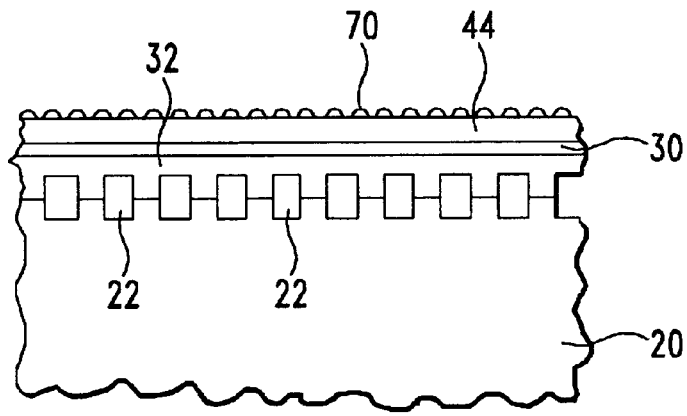
Figure 6H:
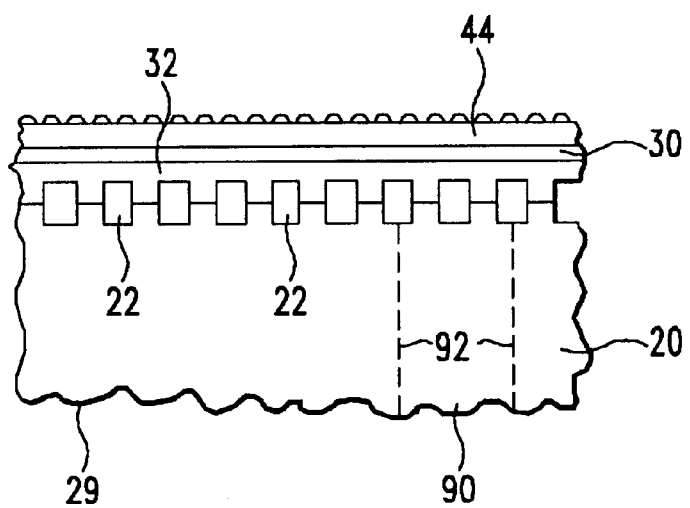

FIGS. 6A through 6H describe the fabrication process of the first embodiment. In FIG. 6A silicon substrate 20 has mask layer 11 formed on its surface. Layer 11 may comprise, for example, a thermal or deposited oxide. In FIG. 6B mask layer 11 has been patterned exposing substrate 20 in areas 15. In FIG. 6C the substrate 20 has been etched forming trenches 14 and plateaus 13. A RIE etch for shallow trenches and a strong caustic wet etch for very deep trenches would be suitable etch techniques. Trenches 14 will eventually become channels 22 or 22A and include inlet manifold channels 94 and 94A, collection channels 95 and 95A and secondary inlet manifolds 96 and 96A At this point the process can proceed as shown in FIG. 6E. However, FIG. 6D shows some additional, optional steps where oxide layer 11 has been removed and new insulating layer 12 formed. Layer 12 may comprise, for example, a thermal or deposited oxide. This step provides for an oxide that may bond better further on in the process sequence and also provides an insulating and corrosion preventative coating in the channel sidewalls and bottoms. In FIG. 6E oxide layer 37 on a surface of second silicon substrate 30 is placed in contact with oxide layer 11 on substrate 20. In FIG. 6F a dielectric bonding process, for example, a high temperature heat cycle, has been performed so oxide layers 11 and 37 form bonding layer 32 and complete channels 22, and substrate 30 has been thinned down to a thickness suitable for further processing. This may be accomplished by conventional polishing techniques or wet etching the wafer in strong caustic followed by a clean-up polish. In FIG. 6G devices (not shown) have been built by conventional means in substrate 30, interlevel wiring 44 formed on top of substrate 30 and solder ball connections 70 formed. Optional thinning of substrate 20 has been shown. This may be accomplished by conventional polishing techniques or wet etching the wafer in strong caustic. In FIG. 6H inlet 90 has been formed in substrate 20.

Figure 7:
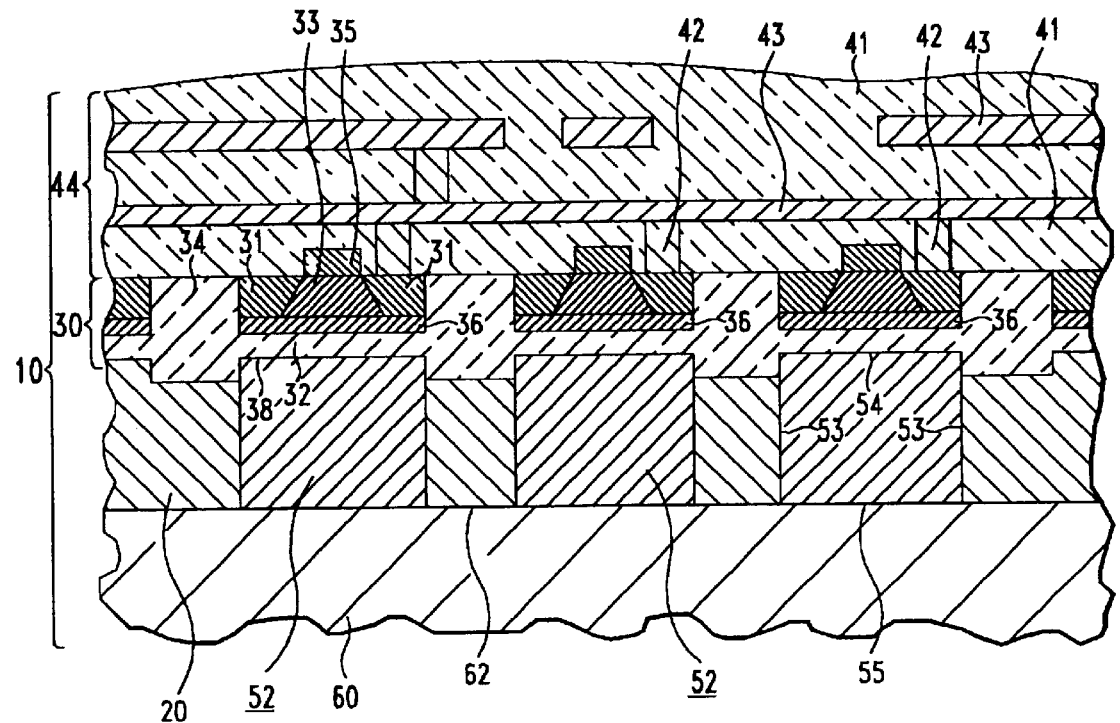
FIG. 7 is a cross-sectional view through part of a chip of a second embodiment of the present invention showing the relationship of the heat conductors to the devices.

FIG. 7 is a cross sectional view, shown through part of a semiconductor chip 10, comprised of a first substrate 20 bonded to a second substrate 30, showing a second embodiment of the present invention. Substrate 30 contains devices 36, comprised of channel regions 33, source and drain regions 31, and gates 35, separated by optional isolation regions 34. Interlevel wiring layer 44, comprised of interlevel dielectric levels 41, wiring levels 43 and vias 42 disposed thereon, is formed on substrate 30. Substrate 30 is bonded to substrate 20 by means of oxide layer 32. Substrate 20 contains a plurality of thermal conductors 52 each having sidewalls 53, a bottom surface 55 and a top surface 54. Thermal conductors 52 may be comprised of any suitable thermally conductive material, such as aluminum, copper, or a refractory metal, e.g. tungsten. Top surface 54 of each thermal conductor 52 is in contact with surface 38 of oxide layer 32. Each thermal conductor 52 is sized and located to substantially align with a respective channel region 33 of each of the devices 36. To collect the heat from each of thermal conductors 52, bottom surface 55 of conductor 52 is in contact with top surface 62 of collector 60. Collector 60 may also be comprised of any suitable thermally conductive material, such as aluminum, copper, or a refractory metal, e.g. tungsten.

Figure 8:
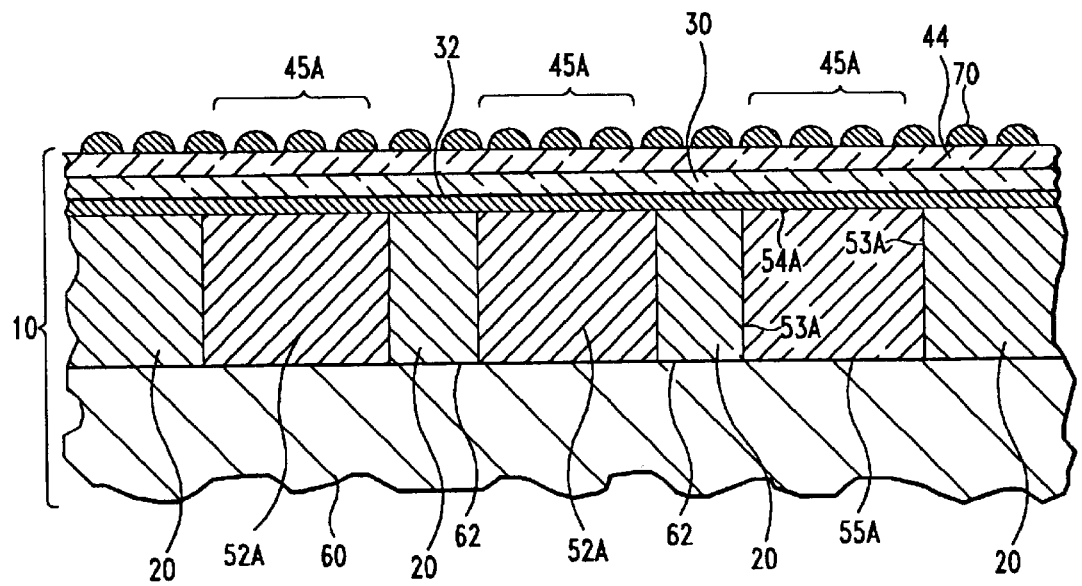
FIG. 8 is a cross-sectional view through part of a chip of a variation of the second embodiment of the present invention showing the relationship of the heat conductors to portions of the chip.

In FIG. 8 is similar to FIG. 7 except the scale is much smaller. Thermal conductors 52A are sized and located to align with regions 45A of substrate 30, the regions containing a plurality of devices so each thermal conductor 52A cools many devices 36. In this case the thermal conductors 52A may be much larger than thermal conductors 52 shown in FIG. 7, and cooling could be made selective to certain portions of chip 10. Solder ball connections 70 are also shown, though wire bond or other interconnection technology would also be suitable, as should be apparent to those skilled in the art.

Figure 9:
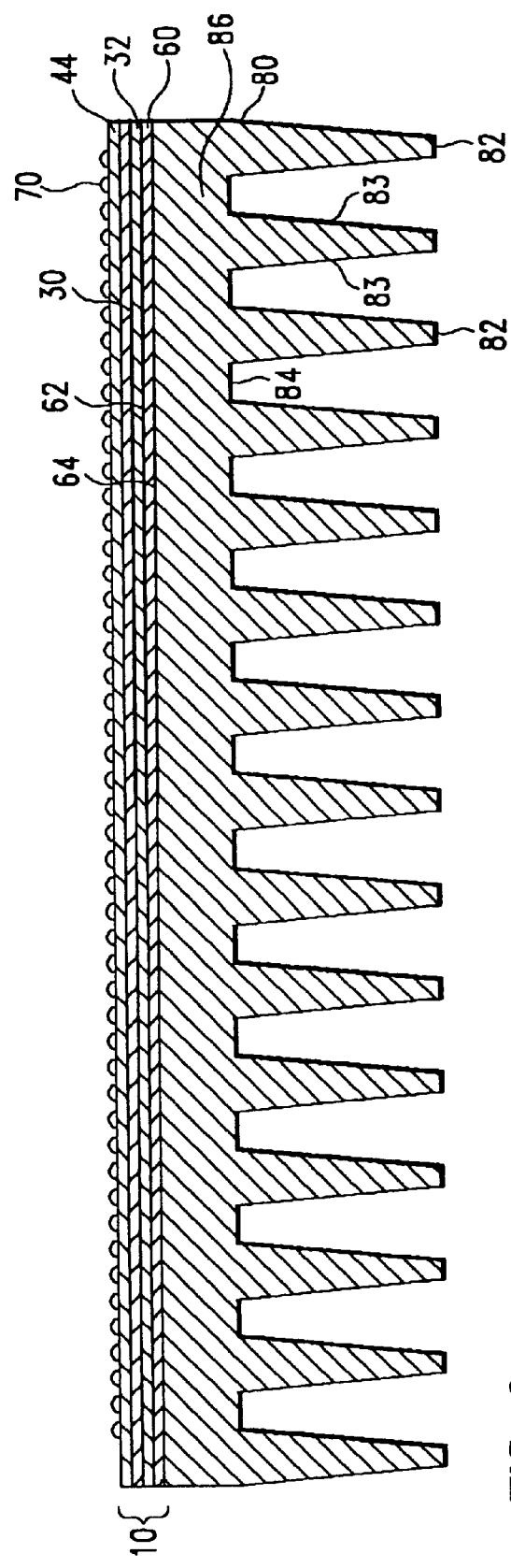
FIG. 9 is a cross sectional view through a chip illustrating the attachment of a heat sink to the chip.

FIG. 9 shows an entire chip 10 according to the second embodiment attached to a heatsink 80. Bottom surface 64 of collector 60 is in thermal contact with top surface 86 of heatsink 80. Heatsink 80 has fins 82 and is comprised of traditional heatsink materials, such as aluminum, copper or stainless steel.

Figure 10:
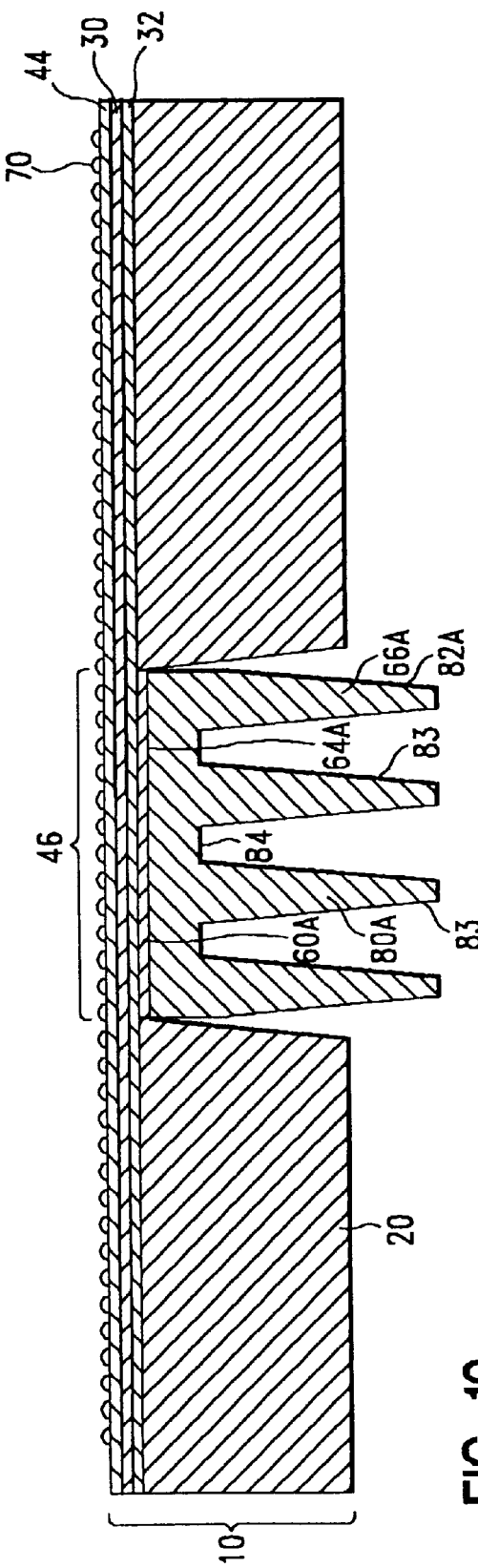
FIG. 10 is cross sectional view through a chip illustrating another attachment of a heat sink to a portion of the chip.

A variation of the second embodiment is illustrated in FIG. 10. Conductors 52 or 52A and collector 60A are formed in only one portion of chip 10, under a section 46 of chip 10 that generates the most significant amount of heat. Chip 10 has been left much thicker and thinned only where collector 60A and heatsink 80A need to be for removing heat from section 46.

Figure 11A:
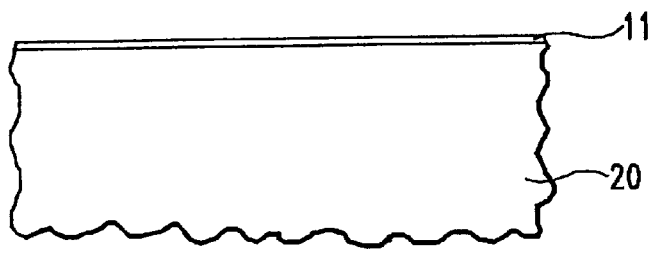
FIGS. 11A thru I are side views through part of a chip showing a method of fabrication of the second embodiment of the present invention.
Figure 11B:
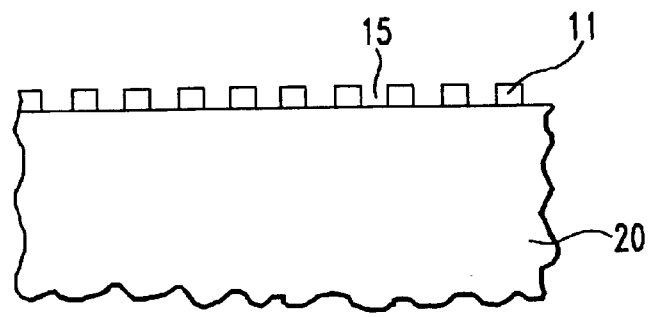
Figure 11C:
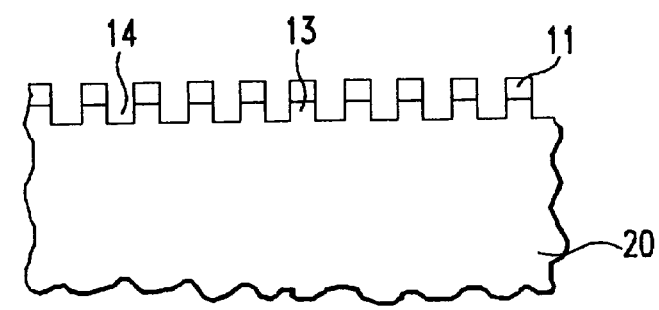
Figure 11D:
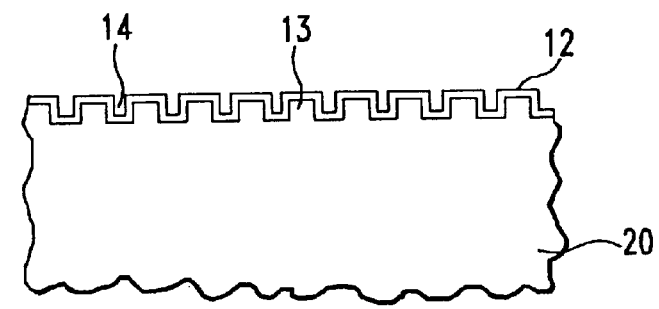
Figure 11E:
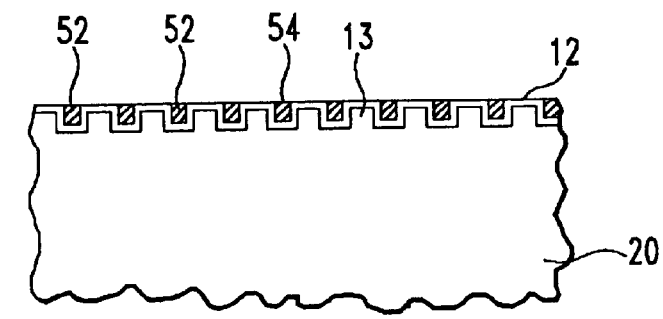
Figure 11F:
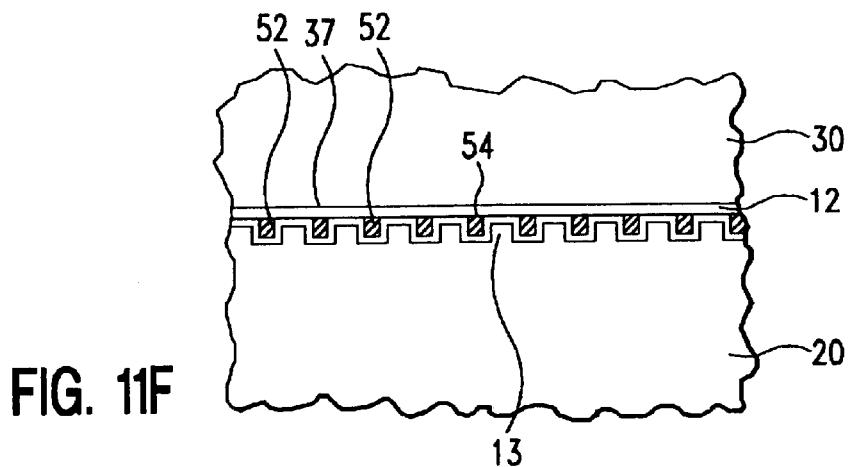
Figure 11G:
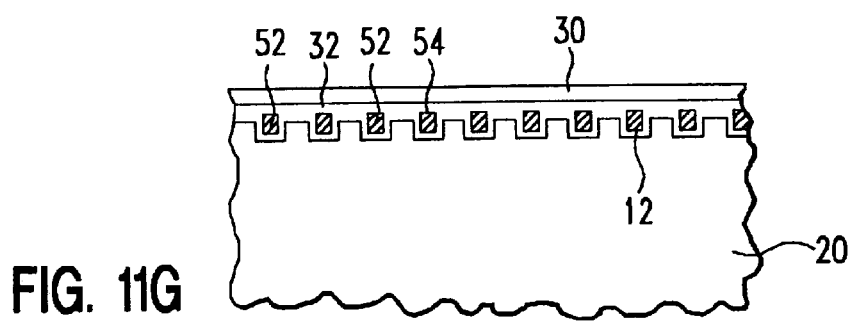
Figure 11H:
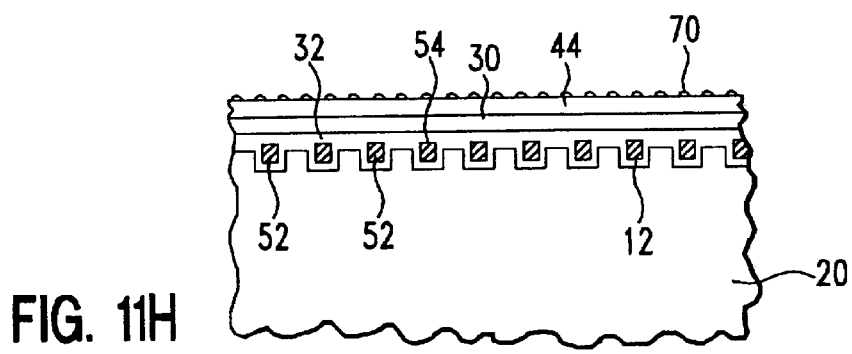

FIGS. 11A through 11I describe the fabrication process of a second embodiment. As shown in FIG. 11, a silicon substrate 20 has mask layer 11 formed on its surface. Layer 11 may comprise a thermal or deposited oxide. In FIG. 11B mask layer 11 has been patterned exposing substrate 20 in areas 15. In FIG. 11C the substrate 20 has been etched forming trenches 14 and plateaus 13. A RIE etch for shallow trenches and a strong caustic wet etch for very deep trenches would be suitable etch techniques. In FIG. 11D oxide layer 11 has been removed and new insulating layer 12 formed. Layer 12 may comprise, for example, a thermal or deposited oxide. This step provides for an oxide that may bond better further on in the process sequence and also provides electrical insulation between thermal conductors 52 or 52A which may be desirable for reliability reasons. In FIG. 11E thermal conductors 52 or 52A have been formed by depositing a metal such as aluminum or tungsten, filling up trenches 14 and then polishing to expose top 54 of thermal conductors 52 but leaving portions of oxide layer 12. In FIG. 11F oxide layer 37 on a surface of second silicon substrate 30 is placed in contact with oxide layer 12 on substrate 20. In FIG. 11G a dielectric bonding process has been performed forming bonding layer 32 from oxide layers 37 and 12, and substrate 30 has been thinned down to a thickness suitable for further processing. This may be accomplished by conventional polishing techniques or wet etching the wafer in strong caustic followed by a clean-up polish. In FIG. 11H devices (not shown) have been built by conventional means in substrate 30, interlevel wiring 44 formed on top of substrate 30 and solder ball connections 70 formed.

Figure 11I:
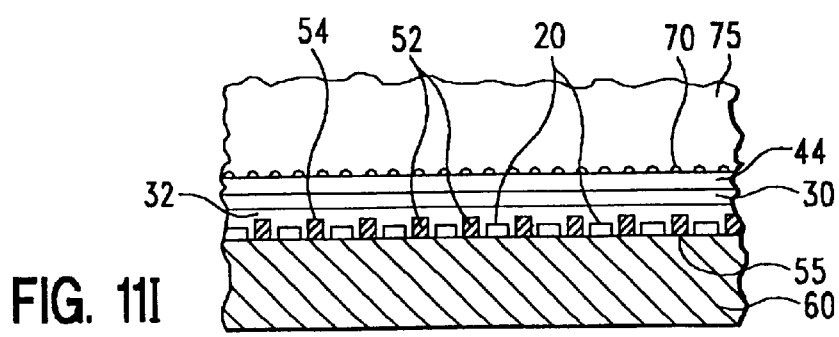

In FIG. 11I a temporary handle 75 has been attached allowing thinning of substrate 20 until bottom 55 of thermal conductor 52 is reached. Collector layer 60 may now be formed and heatsink 80 attached. If only a small heat sink 80A, as shown in FIG. 10, is to be attached, an isotropic wet etch with a caustic solution followed by a dilute HF dip to remove oxide my be used to expose the thermal conductors. The handle 75 may be removed at this point.

The description of the embodiment of the present invention is given above for the understanding of the present invention. It will be understood that the invention is not limited to the particular embodiments described herein, but is capable of various modifications, and rearrangements and substitutions will now become apparent to those skilled in the art without departing from the scope of the invention.

Therefore it is intended that the following claims cover all such modifications and changes as fall within the true spirit and scope of the invention.

What is claimed is:

1. A structure for cooling individual semiconductor devices or groups of semiconductor devices fabricated in silicon on insulator technology, comprising:

a silicon substrate;

an insulating layer disposed over said substrate;

a semiconductor layer disposed over said insulating layer; and at least one semiconductor device or group of semiconductor devices formed in said semiconductor layer and in said insulating layer; and wherein said substrate has at least one channel formed therein, wherein the channel has an upper surface in contact with said insulating layer and at least a portion of the channel is located beneath said semiconductor device or group of semiconductor devices.

2. The electronic device of claim 1, wherein said substrate comprises silicon and said insulating layer comprises silicon oxide.

3. The electronic device of claim 2, further comprising a protective layer and wherein the channel has bottom and side surfaces which are coated with said protective layer.

4. The electronic device of claim 3, wherein said protective layer comprises silicon oxide.

5. The electronic device of claim 1, further comprising means for delivering a cooling fluid to the channel.

6. The electronic device of claim 1, wherein the channel includes a thermal conductor.

7. The electronic device of claim 6, wherein said thermal conductor comprises aluminum, copper or a refractory metal.

8. The electronic device of claim 1, wherein said refractory metal is tungsten.

9. The electronic device of claim 7, further comprising a thermal collector in contact with said thermal conductor and a heatsink in contact with said thermal collector.

10. The electronic device of claim 1, wherein said substrate includes a separate channel for each said semiconductor device.

11. The electronic device of claim 1, wherein said substrate includes a channel which is located beneath more than one semiconductor device.

* * * * *